United States Patent [19]

Yoshinaga et al.

[11] Patent Number: 5,504,980
[45] Date of Patent: Apr. 9, 1996

[54] METHOD OF MANUFACTURING A CHIP-TYPE PIEZOELECTRIC-RESONATOR

[75] Inventors: Takashi Yoshinaga; Motohide Yonemura, both of Kyoto, Japan

[73] Assignee: Murata Manufacturing Co., Ltd., Japan

[21] Appl. No.: 197,135

[22] Filed: Feb. 17, 1994

Related U.S. Application Data

[62] Division of Ser. No. 138,358, Oct. 18, 1993, abandoned.

[30] Foreign Application Priority Data

Oct. 19, 1992 [JP] Japan .................................. 4-280008

[51] Int. Cl.$^6$ ............................ H01L 41/22; H03H 9/17; H03H 3/02
[52] U.S. Cl. ............................ 29/25.35; 29/417; 29/423; 29/856; 310/340; 310/366; 333/187
[58] Field of Search ............................ 29/25.35, 415, 29/417, 423, 760, 856, DIG. 1, DIG. 29; 310/340, 344, 366, 321–325; 333/187–192

[56] References Cited

U.S. PATENT DOCUMENTS

| 4,920,641 | 5/1990 | Nakamura | 29/856 |
|---|---|---|---|
| 4,995,149 | 2/1991 | Arvika et al. | 29/25 |
| 5,192,925 | 3/1993 | Kaida | 333/187 |
| 5,357,662 | 10/1994 | Takagi et al. | 29/25 |

FOREIGN PATENT DOCUMENTS

| 299310 | 12/1990 | Japan | 333/187 |
|---|---|---|---|
| 109707 | 4/1992 | Japan | 29/25 |

*Primary Examiner*—Peter Vo
*Attorney, Agent, or Firm*—Ostrolenk, Faber, Gerb & Soffen

[57] ABSTRACT

In order to define cavities for vibrating spaces in a chip-type piezoelectric-resonator, which is protected with resin so as to be capable of surface mounting, a mother substrate including a piezoelectric substrate and a plurality of piezoelectric resonance elements formed thereon is prepared, and upraised adhesive layers in the form of walls are provided on respective major surfaces of the mother substrate so as to enclose the vibrating region of the mother substrate. Mother sheets, which are provided with plural cover sheets, are arranged so as to cover both the major surfaces of the mother substrate, thereby defining cavities for vibrating spaces therebetween. Then, protective resin members are applied to cover both the major surfaces of the mother substrate, which in turn is divided to obtain a plurality of chip-type piezoelectric-resonators.

7 Claims, 8 Drawing Sheets

METHOD OF MANUFACTURING A CHIP-TYPE PIEZOELECTRIC-RESONATOR

This is a division of application Ser. No. 08/138,358, filed Oct. 18, 1993 now abandoned.

BACKGROUND OF THE INVENTION

1. Field of the Invention

The present invention relates to a chip-type piezoelectric-resonator, which is applied to a chip-type filter, oscillator, or discriminator, for example, and a method of manufacturing the same.

2. Description of the Background Art

Conventionally, a piezoelectric-resonator which is applied to a filter, an oscillator or a discriminator is provided with lead wires.

In recent years, however, a surface mounting technique has been employed in order to miniaturize an electronic device, leading to a requirement for a chip-type piezoelectric-resonator having no lead wires. A concrete example of such a chip-type piezoelectric-resonator is now described with reference to FIGS. 11 to 13.

As shown in FIGS. 11 to 13, a piezoelectric-resonator 1 comprises a piezoelectric substrate 2. Split vibrating electrodes 3 and 4 are formed on one major surface of the piezoelectric substrate 2, while still another vibrating electrode 5 is formed on another major surface of the substrate 2 so as to be opposite to the vibrating electrodes 3 and 4. These vibrating electrodes 3, 4 and 5 are respectively connected with terminal electrodes 6, 7 and 8, which are located on an edge of the piezoelectric substrate 2.

This piezoelectric-resonator 1 operates as an energy trapping type double mode piezoelectric-resonator utilizing a thickness vibration mode. The piezoelectric-resonator 1, as described above, has the split vibrating electrodes 3 and 4 and the vibrating electrode 5, which is opposite thereto. As shown in FIG. 12, resin plates 11 and 12 of polyphenylene sulfide (PPS), having cavities 9 and 10 formed in portions corresponding to the vibrating electrodes 3 to 5, respectively, are arranged on both surfaces of the piezoelectric substrate 2, and fixed to the piezoelectric substrate 2 by adhesives 13 and 14. As shown in FIG. 13, external electrodes 15, 16 and 17 are formed on an outer surface of the piezoelectric-resonator 1, and are electrically connected with the terminal electrodes 6, 7 and 8, respectively.

Such a chip-type piezoelectric-resonator 1 is advantageously miniaturized to enable surface mounting.

However, although the resin plates 11 and 12 are bonded to the piezoelectric substrate 2 by the adhesives 13 and 14, the adhesive strength is relatively weak and hence, it is difficult to suppress a spurious response by preventing undesired vibration in a portion other than a vibrating portion of the piezoelectric-resonator 1.

Further, the use of adhesives 13 and 14 may cause permeation of water through interfaces between the piezoelectric substrate 2 and the resin plate 11 and 12, leading to inferior in moisture resistance in the piezoelectric-resonator 1.

In addition, it is difficult to align the vibrating electrodes 3 to 5 with the cavities 9 and 10 of the resin plates 11 and 12 since the resin plates 11 and 12 are bonded to the piezoelectric substrate 2 by the adhesives 13 and 14. This condition hinders automation of the manufacturing process.

The aforementioned cavities that form vibrating spaces for the vibrating electrodes may alternatively be formed by a method of applying a material for forming cavities such as wax, for example, to a region of the piezoelectric substrate that vibrates, and thereafter applying thermosetting protective resin so that the material such as wax migrates into the protective resin when the protective resin is hardened. According to this method, however, it is difficult to attain high accuracy in the areas and the shapes of the portions which are supplied with the cavity forming material. Furthermore, if the material for forming cavities is prepared from wax, the wax which is absorbed in the protective resin may be gasified when external electrodes are formed by sputtering or vacuum deposition under a high temperature condition, to hinder the formation of the electrodes.

SUMMARY OF THE INVENTION

Accordingly, an object of the present invention is to provide a chip-type piezoelectric-resonator and a method of manufacturing the same, which can solve the aforementioned problems.

In order to solve the aforementioned technical problems, the chip-type piezoelectric-resonator according to the present invention has the following structure:

This chip-type piezoelectric-resonator comprises a piezoelectric resonance element including a piezoelectric substrate, vibrating electrodes which are opposite to each other through the piezoelectric substrate, and terminal electrodes which are connected with the vibrating electrodes, respectively. In order to enclose a vibrating region of the piezoelectric resonance element, peripheral walls formed by adhesive layers are provided on major surfaces of the piezoelectric resonance element, respectively. Cover sheets are arranged on the respective adhesive layers, thereby defining cavities having thicknesses corresponding to those of the adhesive layers between the same and the vibrating region. Further, protective resin members are applied to cover both major surfaces of the piezoelectric substrate and the cover sheets.

In order to solve the aforementioned technical problems, the method of manufacturing a chip-type piezoelectric-resonator according to the present invention comprises the following steps:

First, a mother substrate is prepared comprising a piezoelectric substrate and a plurality of piezoelectric resonance elements, which are provided on the piezoelectric substrate, each including vibrating electrodes, which are opposite to each other through the piezoelectric substrate, and terminal electrodes, which are connected with the vibrating electrodes, respectively. Then, peripheral walls formed by adhesive layers are formed on respective major surfaces of the mother substrate, so as to enclose respective vibrating regions of the piezoelectric resonance elements. On the other hand, also provided are mother sheets, each of which is provided with a plurality of cover sheets for covering spaces enclosed by peripheral walls formed by the adhesive layers, respectively. These mother sheets are arranged so as to cover the respective major surfaces of the mother substrate, so that the cover sheets are bonded to the respective adhesive layers. Thereafter, thermosetting protective resin members are applied so as to cover both major surfaces of the mother substrate. Then, the mother substrate, which is covered with the protective resin members, is divided into independent piezoelectric resonance elements so that the terminal electrodes are exposed on divided surfaces, thereby obtaining a plurality of chip-type piezoelectric-resonators.

According to the inventive chip-type piezoelectric-resonator, cavities or spaces for forming vibrating spaces are defined by the peripheral walls of the adhesive layers and the cover sheets, whereby such cavities can be formed in correct or desired shapes. Thus, it is possible to form the cavities uniformly in height, and to reduce the cavities in height, thereby reducing the piezoelectric-resonator in height with no problem.

When the protective resin members are joined entirely along peripheral edges of both major surfaces of the piezoelectric substrate in the piezoelectric-resonator according to the present invention, high bond strength is attained between the protective resin members and the piezoelectric substrate, whereby it is possible to sufficiently suppress undesired vibration in a portion other than the vibrating portion of the piezoelectric-resonator. Further, it is possible to improve moisture resistance of the piezoelectric-resonator.

According to the inventive method of manufacturing a piezoelectric-resonator, on the other hand, the adhesive layers are formed in alignment with vibrating regions of the plurality of piezoelectric resonance elements which are provided by the mother substrate, the mother sheets are then arranged to cover respective major surfaces of the mother substrate so that the cover sheets are bonded to the adhesive layers, and the protective resin members are thereafter applied. Thus, the protective resin members are applied upon confirmation of proper alignment of the cavities and the vibrating regions, whereby it is possible to prevent manufacturing of a piezoelectric-resonator having cavities which are formed in improper positions.

According to the inventive manufacturing method, further, the mother substrate which is covered with the protective resin members is finally divided so as to obtain a plurality of chip-type piezoelectric-resonators, whereby it is possible to efficiently obtain a number of chip-type piezoelectric-resonators. As hereinabove described, the cavities are regularly formed reliably in proper states so that no parts of the cavities are exposed by division of the mother substrate, whereby it is possible to improve the manufacturing yield.

Further, it is possible to form the cavities without use of a material for forming cavities, such as wax. Thus, it is possible to advantageously solve the aforementioned problem, which is brought about by the cavity forming material, particularly wax. In other words, it is not necessary to consider the problem that arises when wax, which lies concealed in the protective resin members, is gasified so as to hinder formation of external electrodes, whereby the external electrodes can be formed by sputtering or vapor deposition under a high temperature condition with no problem. When the external electrodes are prepared from conductive paste, further, the temperature for baking the same is not restricted and hence it is possible to employ conductive paste, which has excellent solderability but requires a high baking temperature, with no problem.

In the manufacturing method according to the present invention, the mother sheet preferably has a plurality of cover sheets which are held by connecting portions having narrower widths than the cover sheets. Thus, it is possible to protect the protective resin members, which are applied to cover both major surfaces of the mother substrate, so that flows thereof are not much hindered by the connecting portions. In the as-obtained piezoelectric-resonator, therefore, it is possible to easily attain such a state that the protective resin members are joined entirely along peripheral edges of the major surfaces of the piezoelectric substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a perspective view showing in an impended manner elements included in a conventional chip-type piezoelectric-resonator 1 in;

DESCRIPTION OF THE PREFERRED EMBODIMENTS

Figure 9:
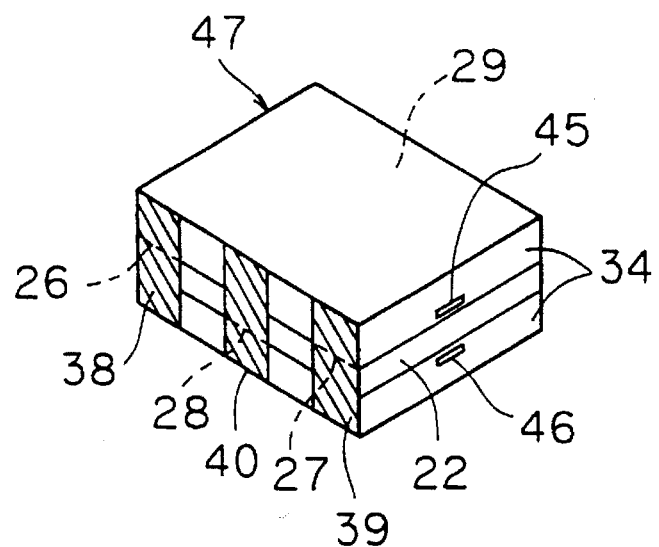
FIG. 9 is a perspective view showing the chip 47 appearing in FIG. 7, which is provided with external electrodes 38 to 40 on its side surface.
Figure 10:
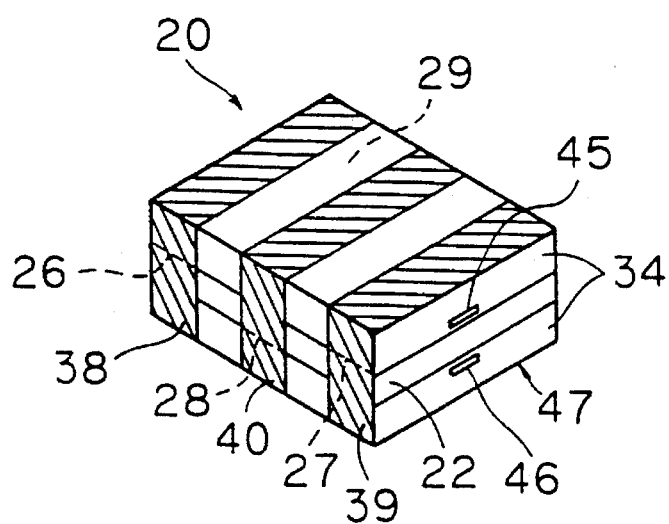
FIG. 10 is a perspective view showing the appearance of the chip-type piezoelectric-resonator 20 according to the embodiment of the present invention, which is obtained by spreading regions of the chip 47 shown in FIG. 9 provided with the external electrodes 38 to 40.
Figure 11:
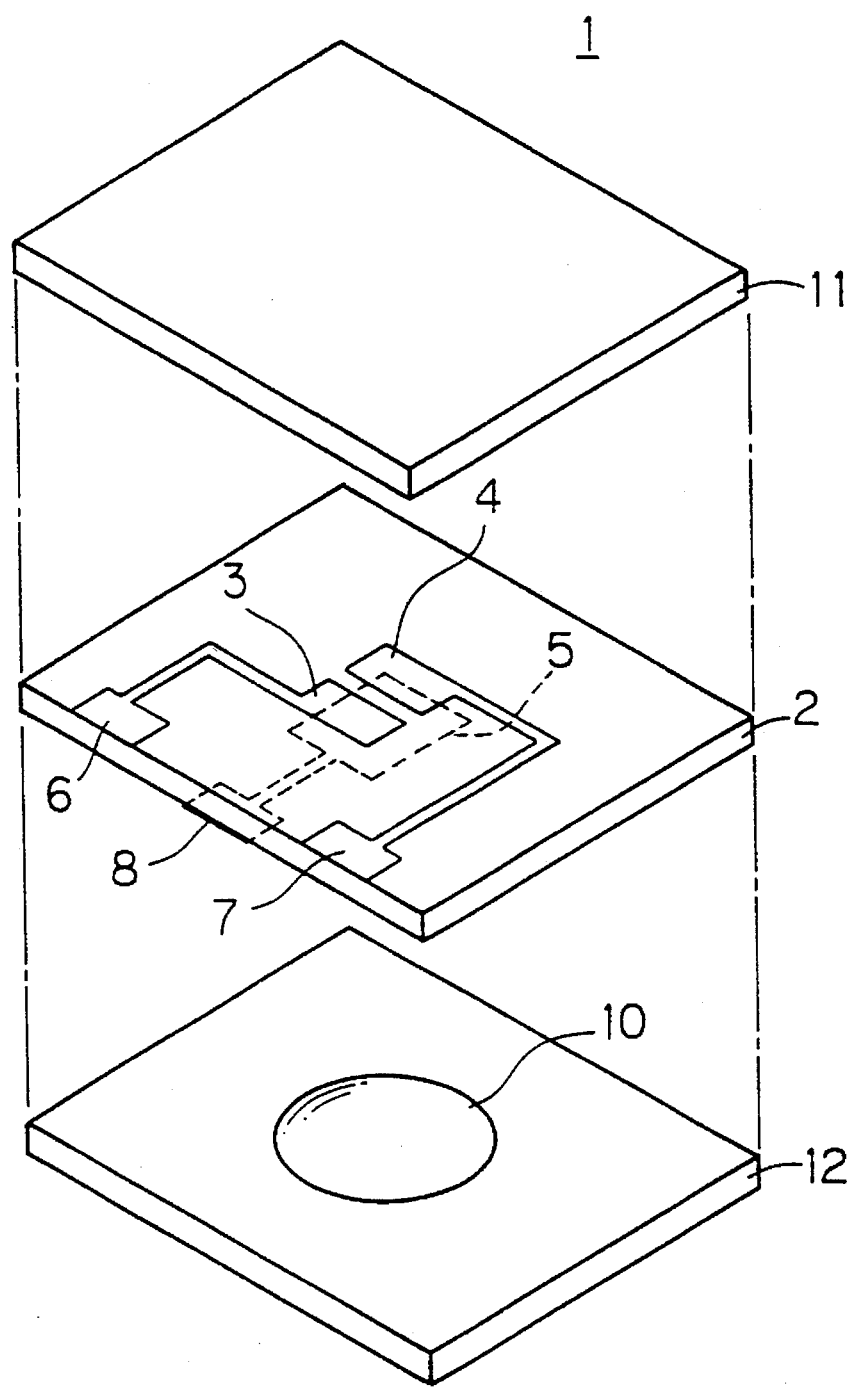
Figure 12:
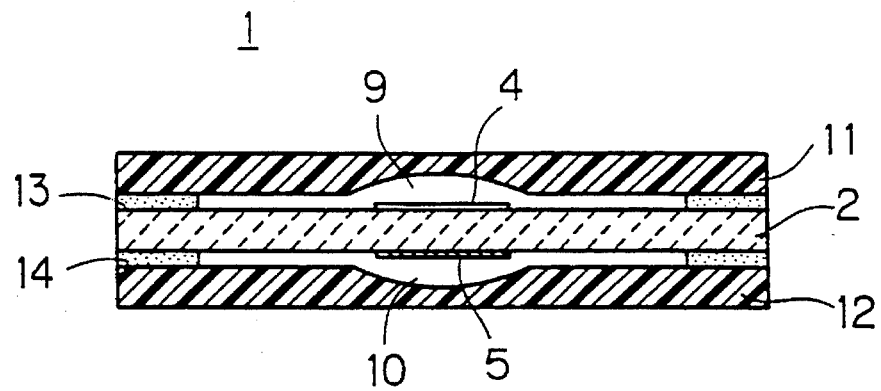
FIG. 12 is a sectional view of the chip-type piezoelectric-resonator 1 shown in FIG. 11.
Figure 13:
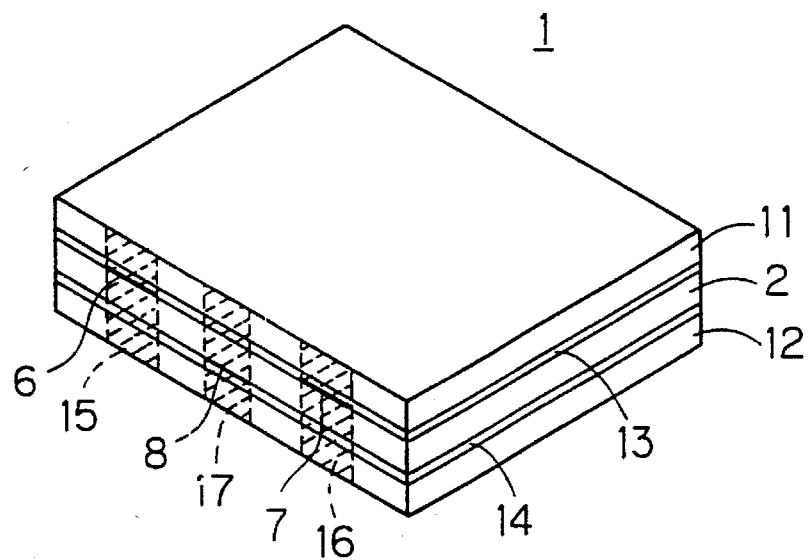
FIG. 13 is a perspective view showing the appearance of the chip-type piezoelectric-resonator 1 shown in FIG. 11.

FIG. 10 is a perspective view showing the appearance of a chip-type piezoelectric-resonator 20 according to an embodiment of the present invention. This piezoelectric-resonator is obtained through steps shown in FIGS. 1 to 9, respectively.

Figure 1:
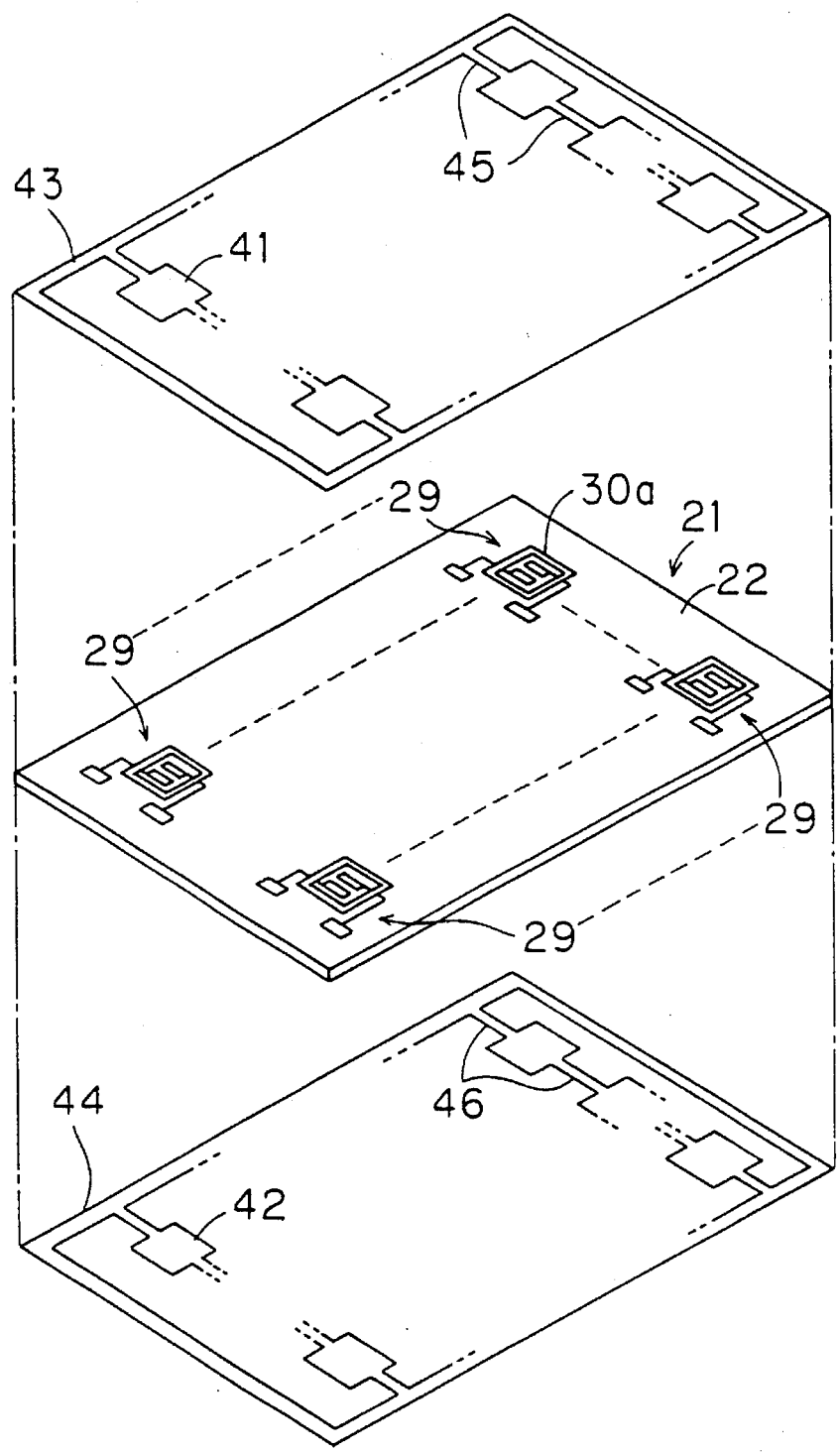
FIG. 1 is a perspective view showing in an exploded manner a mother substrate 21 and mother sheets 43 and 44 which are prepared for obtaining a chip-type piezoelectric-resonator according to an embodiment of the present invention.
Figure 2:
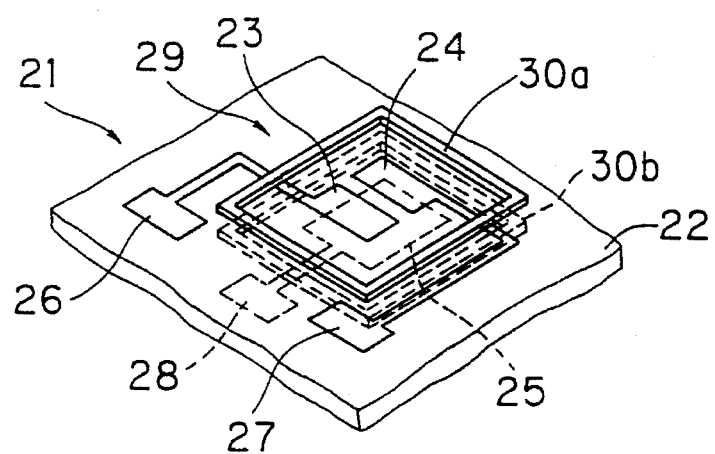
FIG. 2 is a perspective view showing in an enlarged manner a part of the mother substrate 21 shown in FIG. 1.

First, a mother substrate 21 is prepared as shown in FIG. 1. FIG. 2 shows an enlarged view of a part of this mother substrate 21 The mother substrate 21 comprises a piezoelectric substrate 22 of a piezoelectric ceramic material, which is provided with split vibrating electrodes 23 and 24 formed on one major surface thereof, and still another vibrating electrode 25 formed on another major surface so as to be opposite to the vibrating electrodes 23 and 24. Terminal electrodes 26, 27 and 28 are connected to the vibrating electrodes 23, 24 and 25, respectively. Each combination of the vibrating electrodes 23 to 25 and the terminal electrodes 26 to 28 defines a single piezoelectric resonance element 29, so that the mother substrate 21 provides a plurality of such piezoelectric resonance elements 29 (as shown in FIG. 1).

Each piezoelectric resonance element 29 operate as an energy trap trapping double mode piezoelectric-resonator utilizing a thickness vibration mode, which has the split vibrating electrodes 23 and 24 and the vibrating electrode 25 being opposite thereto. In order to ensure vibrating spaces for the vibrating electrodes, the following proceedings are employed:

First, as shown in FIG. 2, upraised adhesive layers 30a and 30b are formed as walls on the respective major surfaces of the mother substrate 21 by printing, for example, so as to enclose the respective vibrating regions of the piezoelectric resonance elements 29.

On the other hand, also prepared are mother sheets 43 and 44, which are partially open at desired locations. The mother sheets 43 and 44 are provided with plural cover sheets 41 and 42 for the covering spaces enclosed with the walls formed by the adhesive layers 30a and 30b, respectively. The cover sheets 41 and 42 are located adjacent to the open areas of the mother sheets 43 and 44. The mother sheets 43 and 44, preferably having electrical insulativity, are formed by papers or thin resin sheets, for example. In such mother sheets 43 and 44, the plural cover sheets 41 and 42 are preferably held by connecting portions 45 and 46 having narrower widths than the cover sheets 41 and 42. Further, the mother sheets 43 and 44 preferably have the same outside dimensions as the mother substrate 21.

The aforementioned mother sheets 43 and 44 are arranged to cover the respective vibrating electrodes located on the major surfaces of the mother substrate 21, so that the cover sheets 41 and 42 are bonded to the adhesive layers 30a and 30b. When the mother sheets 43 and 44 have the same outside dimensions as the mother substrate 21 as described above, these mother sheets 43 and 44 can be easily registered with the mother substrate 21.

Figure 3:
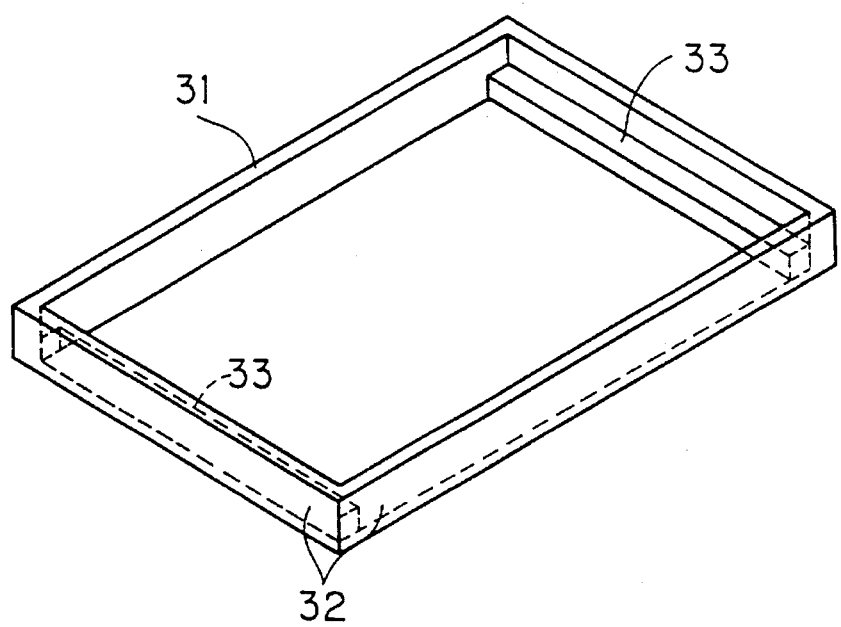
FIG. 3 is a perspective view showing a frame 31 which is employed for obtaining the chip-type piezoelectric-resonator shown in FIG. 1.

On the other hand, a frame 31 of resin, for example, is prepared so that the aforementioned mother substrate 21 can be substantially tightly fitted thereinto, as shown in FIG. 3. This frame 31 is prepared so that the same is neither deformed nor melted by a temperature of about 150° C., for example, for heating and hardening the protective resin, as described later. Outer side surfaces 32 of the frame 31 are preferably planar, if the same are to be used as reference planes in cutting, as described later.

Further, the frame 31 is preferably provided with means capable of fixing the mother substrate 21 received therein substantially at a central portion of the frame 31 along the direction of its thickness. According to this embodiment, shelves or ledges 33 are provided on opposite edges, such as the shorter edges, for example, of the frame 31.

Figure 4:
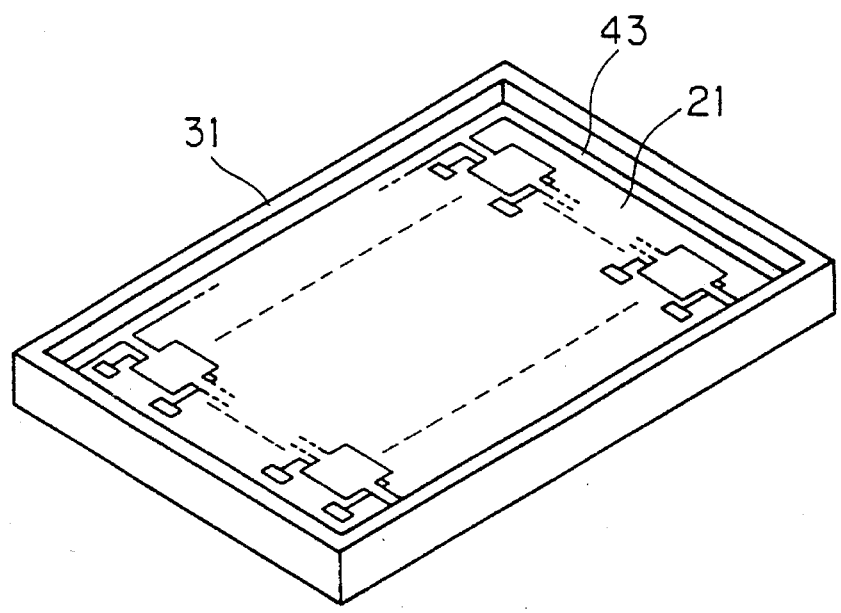
FIG. 4 is a perspective view showing the mother substrate 21 and the mother sheets 43 and 44, shown in FIG. 1, which are fitted into the frame 31 shown in FIG. 3.
Figure 5:
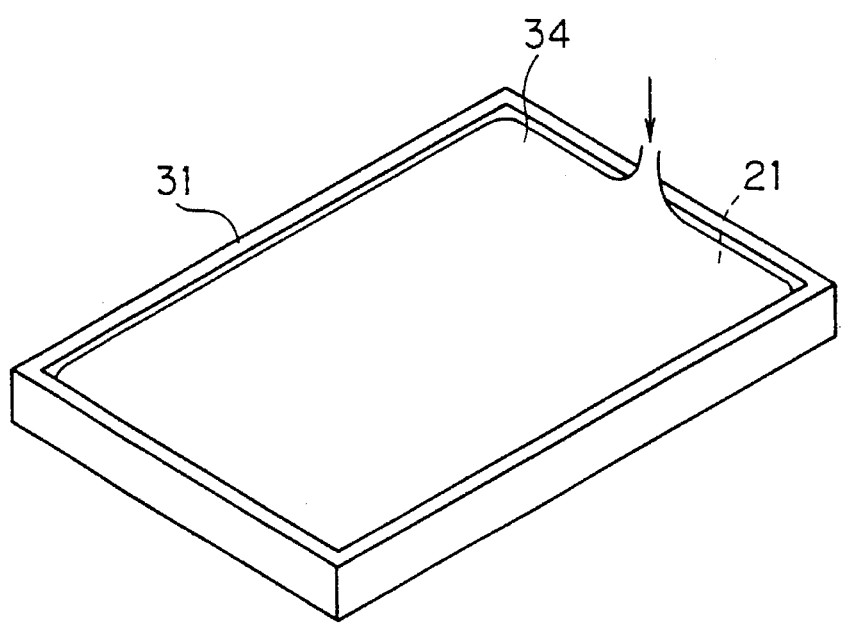
FIG. 5 is a perspective view showing a state in which protective resin 34 is introduced onto the mother substrate 21 shown in FIG. 4.

The mother substrate 21, which has the mother sheets 43 and 44, attached thereto is fitted into the frame 31 as shown in FIG. 4, and an unhardened protective resin 34 is then introduced via the open areas of one of the other sheets 43 and 44 onto one surface of the mother substrate 21 in this state, as shown in FIG. 5. The protective resin 34 is prepared from an epoxy-system thermosetting resin which is liquefied with a solvent, for example. The protective resin 34 is then dried at room temperature, for example, so as not to flow out upon reversal of the frame 31 with the mother substrate 21 retained therein, and, thereafter, the frame 31 is reversed with the mother substrate 21 and the protective resin 34. Additional protective resin 34 is then introduced via the open areas of the other of the mother sheets 43 and 44 onto the other surface of the mother substrate 21. This protective resin 34 is also dried at room temperature, for example.

It is not necessary to insert the mother sheets 43 and 44 and the mother substrate 21 in the frame 31 in already superposed states as described above, but the frame 31 may alternatively be employed as a guide member for registering these elements with each other, so as to successively receive a first mother sheet 43 or 44, the mother substrate 21, and the other mother sheet 44 or 43.

Then, the protective resin members 34, which are introduced in two stages as described above, are heated and hardened at 150° C. for 30 minutes, for example. As hereinabove described, the cover sheets 41 and 42 are held by the relatively thin connecting portions 45 and 46, which hardly block the flow of the protective resin members 34, whereby the protective resin members 34 can be sufficiently introduced into clearances between the connecting portions 45 and 46 and the mother substrate 21.

Then, outer surfaces of the respective protective resin members 34 are polished with the frame 31, in order to improve each chip-type piezoelectric-resonator 20 (see FIG. 10) obtained in dimensional accuracy along the thickness direction and flatness. Such polishing is carried out by lapping with a polishing plate, for example. Thus obtained is a sandwich structure 35 of the mother substrate 21 and the protective resin members 34 covering both surfaces thereof, as shown in FIG. 6.

Figure 6:
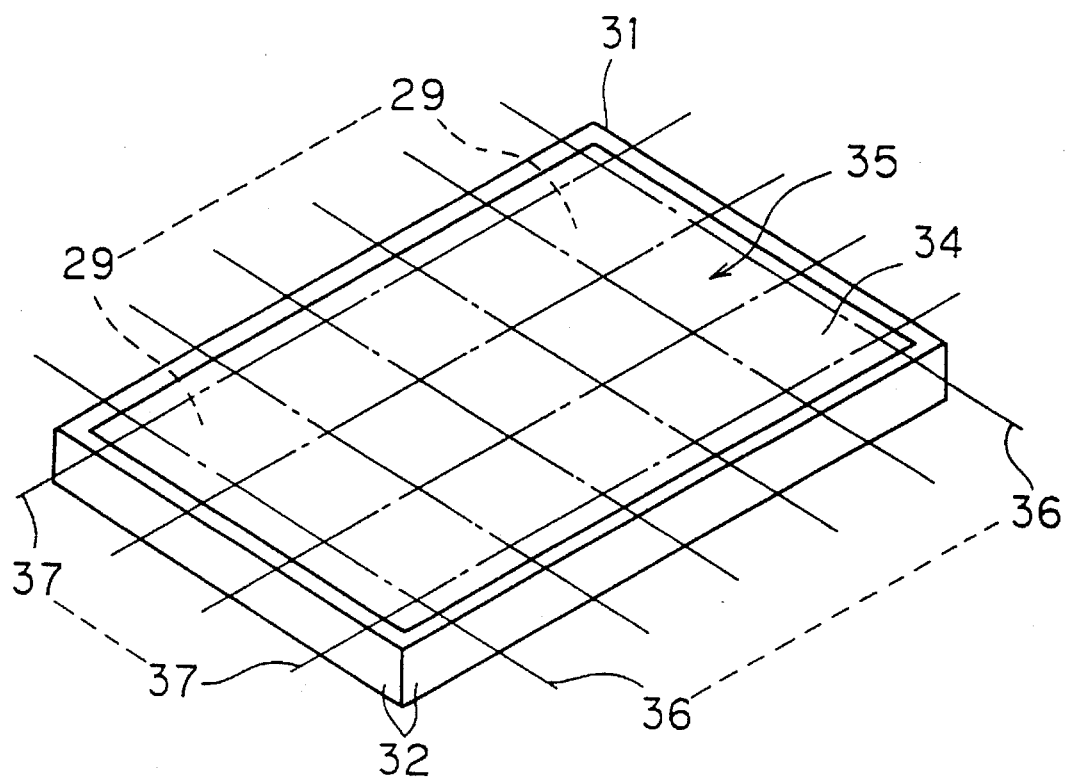
FIG. 6 is a perspective view for illustrating a step of cutting a sandwich structure 35 which is obtained after hardening of the protective resin 34 shown in FIG. 5.

Then, this sandwich structure 35 is cut with the frame 31 along cutting lines 36 and 37 through reference planes defined by the outer side surfaces 32 of the frame 31, as shown in FIG. 6. Thus, the mother substrate 21 is divided into individual piezoelectric resonance elements 29, so that the terminal electrodes 26 to 28 are exposed on the cut surfaces. Thus obtained is a chip 47 shown in FIGS. 7 and 8.

Figure 7:
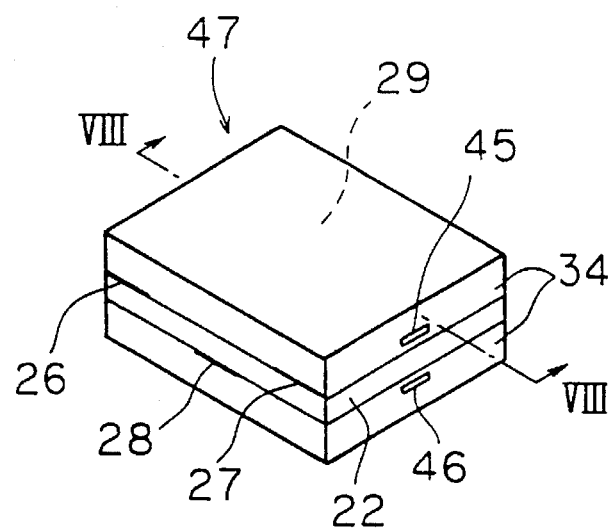
FIG. 7 is a perspective view showing a chip 47 which is obtained through the cutting step shown in FIG. 6.
Figure 8:
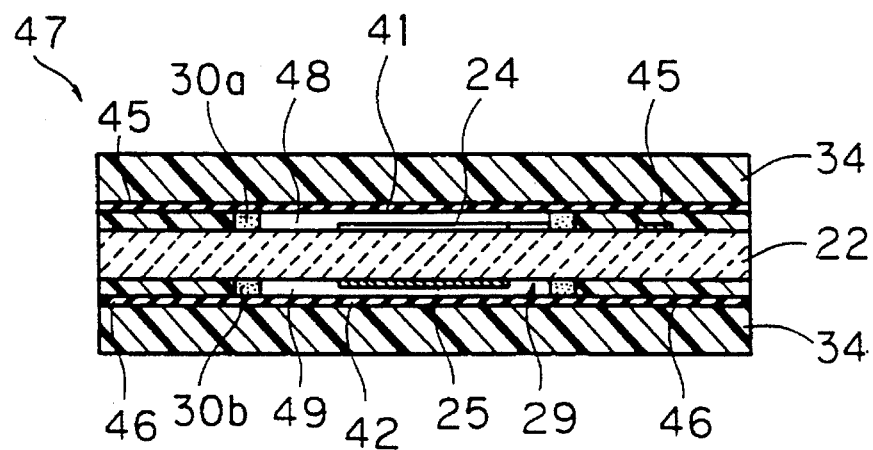
FIG. 8 is a sectional view taken along the line VIII—VIII in FIG. 7.

As shown in FIG. 7, sections of the connecting portions 45 and 46 appear on a prescribed end surface of the chip 47. When the colors of such connecting portions 45 and 46, i.e., the colors of the mother sheets 43 and 44 are identical to those of the protective resin members 34, it is possible to prevent the sections of the connecting portions 45 and 46 from attracting attention on the outer surface of the chip 47. As shogun in FIG. 8, further, the cover sheets 41 and 42 are arranged on the adhesive layers 30a and 30b, respectively, thereby defining cavities 48 and 49 having thicknesses corresponding to those of the adhesive layers 30a and 30b in relation to the vibrating region of the piezoelectric resonance element 29.

Alternatively, aforementioned polishing and cutting step may be carried out after the sandwich structure 35 is taken out from the frame 31.

Then, external electrodes 38 to 40 are applied to at least the surface of the chip 47 exposing the terminal electrodes 26 to 28 by printing and baking of conductive paste, for example, so as to conduct with the terminal electrodes 26 to 28, respectively, as shown in FIG. 9.

While all the terminal electrodes 26 to 28 are exposed on the same surface according to this embodiment, such terminal electrodes may be exposed on separate surfaces. In this case, external electrodes may be applied to the respective ones of such surfaces.

While the chip 47 may be applied to a chip-type piezoelectric-resonator in the state shown in FIG. 9, the external electrodes 38, 39 and 40 provided on one side surface of the chip 47 are preferably further extended toward at least one of the upper and lower surfaces of the chip 47, and further to the other side surface. Thus, it is possible to reliably solder the chip-type piezoelectric-resonator 20, in order to mount the same on a circuit board. Portions of the external electrodes 38 to 40 which are formed on the upper and/or lower surface of the chip-type piezoelectric-resonator 20 may be previously provided in the state of the sandwich structure 35 shown in FIG. 6 by a method such as printing and baking of conductive paste.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a chip-type piezoelectric-resonator, comprising the steps of:

preparing a mother substrate having a piezoelectric substrate and a plurality of piezoelectric resonance elements that are provided on said piezoelectric substrate, each piezoelectric resonance element including vibrating electrodes that are opposite to each other through said piezoelectric substrate and terminal electrodes that are connected with said vibrating electrodes, respectively;

forming peripheral walls comprising adhesive layers on respective major surfaces of said mother substrate so located adjacent to vibrating regions of respective said piezoelectric resonance elements, said peripheral walls comprising adhesive layers defining vibrating spaces;

preparing mother sheets that are each provided with plural cover sheets for covering said vibrating spaces defined by respective said peripheral walls of adhesive layers;

arranging said mother sheets so as to cover said vibrating electrodes of said piezoelectric resonance elements located on said major surfaces of said mother substrate so that respective said cover sheets are bonded to respective said adhesive layers;

thereafter applying thermosetting protective resin members for enclosing said major surfaces of said mother substrate; and then dividing said mother substrate, covered with said protective resin members, so as to separate individual ones of said piezoelectric resonance elements and so as to expose said terminal electrodes on divided surfaces thereof, thereby obtaining a plurality of chip-type piezoelectric-resonators.

2. A method of manufacturing a chip-type piezoelectric-resonator in accordance with claim 1, wherein said plural cover sheets of said mother sheets include connecting portions having narrower widths than said cover sheets and being connected to said plural cover sheets.

3. A method of manufacturing a chip-type piezoelectric-resonator in accordance with claim 2, wherein said connecting portions and said protective resin members have respective colors, and said color of said connecting portions is the same as said color of said protective resin members.

4. A method of manufacturing a chip-type piezoelectric-resonator in accordance with claim 1, wherein said mother substrate and said mother sheets are substantially identical to each other in outside dimension, and said step of arranging said mother sheets to cover said major surfaces of said mother substrate includes a step of registering said mother substrate and said mother sheets with each other by aligning an outer periphery of said mother substrate with an outer periphery of each of said mother sheets.

5. A method of manufacturing a chip-type piezoelectric-resonator in accordance with claim 1, wherein said step of applying protective resin members comprises the steps of:

preparing a frame for surrounding said mother substrate along its periphery;

arranging said mother substrate and said mother sheets in said frame such that a receiving space is formed on each side of said mother substrate, respectively, with a respective one of said major surfaces of said mother substrate serving as a bottom surface of said receiving spaces;

introducing said protective resin members in an unhardened state into said receiving spaces, respectively; and then hardening said protective resin members.

6. A method of manufacturing a chip-type piezoelectric-resonator in accordance with claim 5, further comprising a step of polishing outer surfaces of said protective resin members with said frame in advance of said step of dividing said mother substrate.

7. A method of manufacturing a chip-type piezoelectric-resonator in accordance with claim 5, wherein said step of dividing said mother substrate comprises a step of cutting said frame together with said mother substrate covered with said protective resin members.

\* \* \* \* \*